(12) United States Patent
Jun et al.

(10) Patent No.: US 11,322,602 B2
(45) Date of Patent: May 3, 2022

(54) VERTICAL FIELD-EFFECT TRANSISTOR (VFET) DEVICES AND METHODS OF FORMING THE SAME

(71) Applicant: Samsung Electronics Co., Ltd., Suwon-si (KR)

(72) Inventors: Hwi Chan Jun, Yongin-si (KR); Kang-Ill Seo, Chungcheongbuk-do (KR); Jeong Hyuk Yim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/794,358

(22) Filed: Feb. 19, 2020

(65) Prior Publication Data

US 2021/0111269 A1 Apr. 15, 2021

Related U.S. Application Data

(60) Provisional application No. 62/913,868, filed on Oct. 11, 2019.

(51) Int. Cl.
*H01L 29/66* (2006.01)
*H01L 29/78* (2006.01)

(52) U.S. Cl.
CPC .. *H01L 29/66666* (2013.01); *H01L 29/66545* (2013.01); *H01L 29/66553* (2013.01); *H01L 29/7827* (2013.01)

(58) Field of Classification Search
CPC ................................................. H01L 29/66666
See application file for complete search history.

(56) References Cited

U.S. PATENT DOCUMENTS

| | | | |
|---|---|---|---|
| 9,356,020 B2 | 5/2016 | Colinge et al. | |
| 9,653,465 B1 | 5/2017 | Balakrishnan et al. | |
| 10,056,377 B2 | 8/2018 | Bentley et al. | |
| 10,128,158 B2 | 11/2018 | Anderson et al. | |
| 10,211,316 B2 | 2/2019 | Anderson et al. | |
| 10,249,753 B2 | 4/2019 | Anderson et al. | |
| 10,297,507 B2 | 5/2019 | Cheng et al. | |
| 10,355,106 B2 | 7/2019 | Bao et al. | |
| 10,410,929 B2 | 9/2019 | Zang et al. | |
| 2018/0114850 A1 | 4/2018 | Zhang | |
| 2019/0157161 A1* | 5/2019 | Balakrishnan | ...... H01L 29/1066 |
| 2019/0214309 A1 | 7/2019 | Balakrishnan et al. | |
| 2019/0259854 A1 | 8/2019 | Jagannathan et al. | |
| 2019/0267325 A1 | 8/2019 | Lee et al. | |

* cited by examiner

*Primary Examiner* — Yu-Hsi D Sun
(74) *Attorney, Agent, or Firm* — Myers Bigel, P.A.

(57) ABSTRACT

Vertical field-effect transistor (VFET) devices and methods of forming VFET devices are provided. The methods may include forming a preliminary VFET on a substrate. The preliminary VFET may include a bottom source/drain region on the substrate, a channel region on the bottom source/drain region, a top source/drain region on the channel region, a patterned sacrificial layer on a side surface of the channel region, and an insulating layer. The top source/drain region and the patterned sacrificial layer may be enclosed by the insulating layer. The methods may also include forming a contact opening extending through the insulating layer and exposing a portion of the patterned sacrificial layer, forming a cavity between the channel region and the insulating layer by removing the patterned sacrificial layer through the contact opening, and forming a gate electrode in the cavity.

19 Claims, 21 Drawing Sheets

VERTICAL FIELD-EFFECT TRANSISTOR (VFET) DEVICES AND METHODS OF FORMING THE SAME

CROSS-REFERENCE TO RELATED APPLICATION

This application claims priority to U.S. Provisional Application Ser. No. 62/913,868, entitled VERTICAL FET STRUCTURE WITH THROUGH-CB REPLACEMENT METAL GATE AND METHODS OF FORMING THE SAME, filed in the USPTO on Oct. 11, 2019, the disclosure of which is hereby incorporated by reference herein in its entirety.

FIELD

The present disclosure generally relates to the field of electronics and, more particularly, to vertical field-effect transistor (VFET) devices.

BACKGROUND

Various structures and manufacturing processes of VFET devices have been researched because of high scalability of VFET devices. Therefore, developing manufacturing processes that improve performance and/or reliability of VFET devices may be beneficial.

SUMMARY

According to some embodiments of the present inventive concept, a gate electrode may be formed after a top source/drain region is formed. Accordingly, properties of the gate electrode may not be affected by a process of forming top source/drain region. Specifically, the gate electrode may not be oxidized or may not get damaged by heat. In some embodiments, the gate electrode may be formed by a replacement gate process performed through a gate contact opening in which a gate contact is subsequently formed. In some embodiments, the top source/drain region may be formed in an opening of an insulating layer and may be confined in the opening.

According to some embodiments of the present inventive concept, methods of forming VFET devices may include forming a preliminary VFET on a substrate. The preliminary VFET may include a bottom source/drain region on the substrate, a channel region on the bottom source/drain region, a top source/drain region on the channel region, a patterned sacrificial layer on a side surface of the channel region, and an insulating layer. The bottom source/drain region, the channel region, and the top source/drain region may be sequentially stacked on the substrate. The top source/drain region and the patterned sacrificial layer may be enclosed by the insulating layer. The methods may also include forming a contact opening extending through the insulating layer and exposing a portion of the patterned sacrificial layer, forming a cavity between the channel region and the insulating layer by removing the patterned sacrificial layer through the contact opening, and forming a gate electrode in the cavity.

According to some embodiments of the present inventive concept, methods of forming VFET devices may include forming a mask layer on a substrate, forming a channel region by etching the substrate using the mask layer as an etch mask, forming a bottom source/drain region on the substrate, forming a first liner extending on a side surface of the channel region and on a side surface and an upper surface of the mask layer, forming a patterned sacrificial layer on a lower portion of the side surface of the channel region, forming a top spacer on an upper portion of the side surface of the channel region, and forming an insulating layer on the substrate. The top spacer and the patterned sacrificial layer may be enclosed by the insulating layer. The methods may also include forming a top source/drain opening in the insulating layer by removing the mask layer and a portion of the top spacer, forming a top source/drain region in the top source/drain opening, forming a contact opening extending through the insulating layer and exposing a portion of the patterned sacrificial layer, and forming a gate electrode on the lower portion of the side surface of the channel region by replacing the patterned sacrificial layer with the gate electrode through the contact opening.

According to some embodiments of the present inventive concept, methods of forming VFET devices may include forming a VFET on a substrate. The preliminary VFET may include a bottom source/drain region on the substrate, a channel region on the bottom source/drain region, a top source/drain region on the channel region, and a gate electrode on a side surface of the channel region. The bottom source/drain region, the channel region, and the top source/drain region may be sequentially stacked on the substrate. The gate electrode may include a work function layer and a metallic electrode sequentially stacked on the side surface of the channel region, and the work function layer may enclose the metallic electrode in a cross-sectional view.

DETAILED DESCRIPTION

Figure 1:
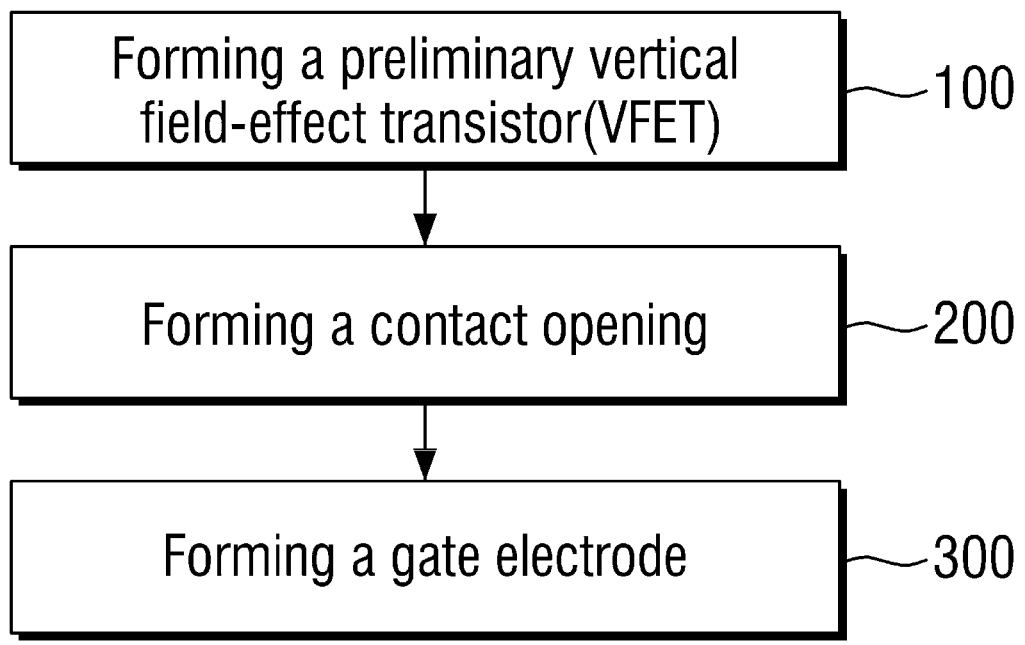
FIG. 1 is a flowchart illustrating methods of forming a VFET device according to some embodiments of the inventive concept.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

FIG. 1 is a flowchart illustrating methods of forming a VFET device according to some embodiments of the inventive concept. Referring to FIG. 1, the methods may include forming a preliminary VFET (e.g., a VFET shown in FIG. 13) (Block 100) and then sequentially forming a contact opening (e.g., a contact opening 62 in FIG. 14) (Block 200) and forming a gate electrode (e.g., a gate electrode 74 in FIG. 18) (Block 300). The preliminary VFET may include a top source/drain region (e.g., top source/drain region 52 in FIG. 18) and thus the gate electrode may be formed after the top source/drain region is formed.

Figure 13:
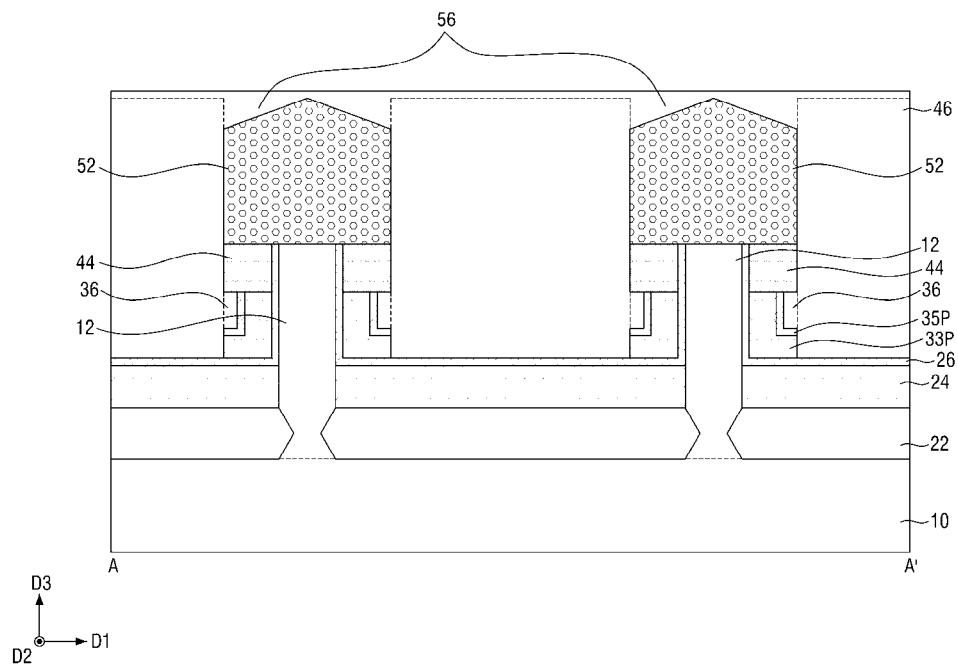

The preliminary VFET may further include a bottom source/drain region (e.g., a bottom source/drain region 22 in FIG. 13), a channel region (e.g., a channel region 12 in FIG. 13), a patterned sacrificial layer (e.g., a patterned sacrificial layer 33p in FIG. 13), and an insulating layer (e.g., a second insulating layer 46 in FIG. 13). The bottom source/drain region, the channel region, and the top source/drain region are sequentially stacked on a substrate (e.g., a substrate 10 in FIG. 13).

Figure 2:
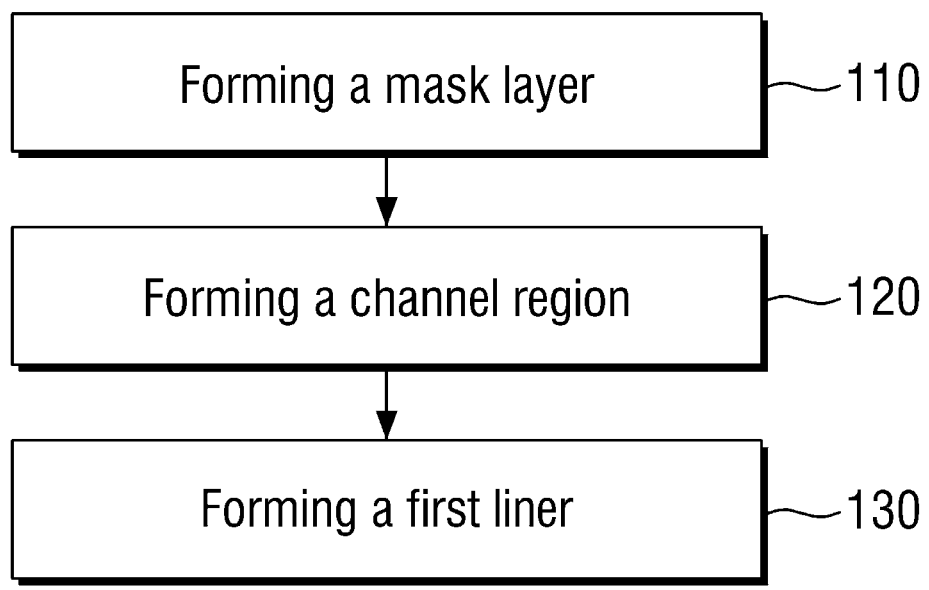
FIG. 2 is a flowchart illustrating methods of forming a VFET device according to some embodiments of the inventive concept.
Figure 14:
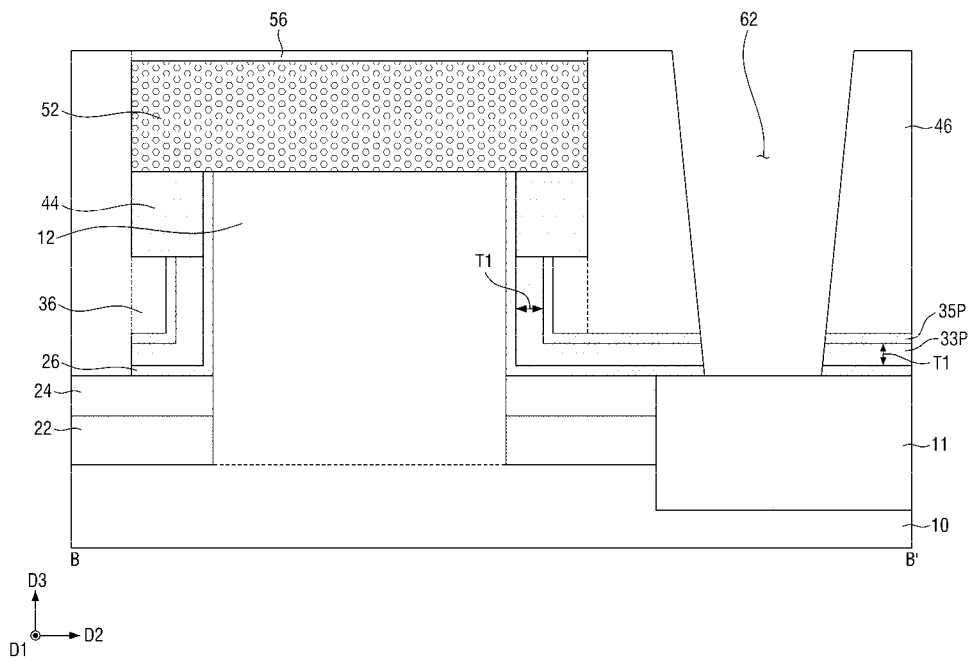
Figure 17:
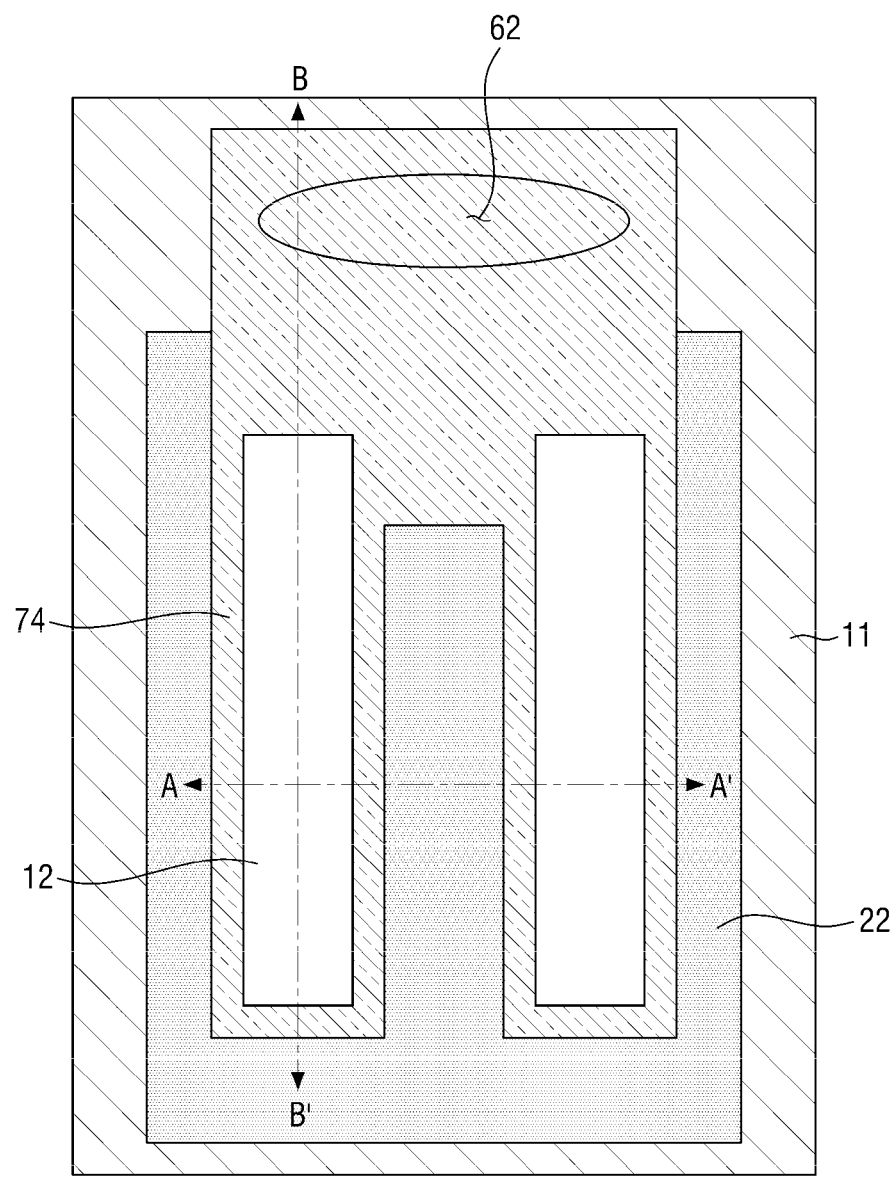
Figure 17:
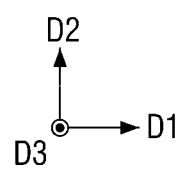
Figure 18:
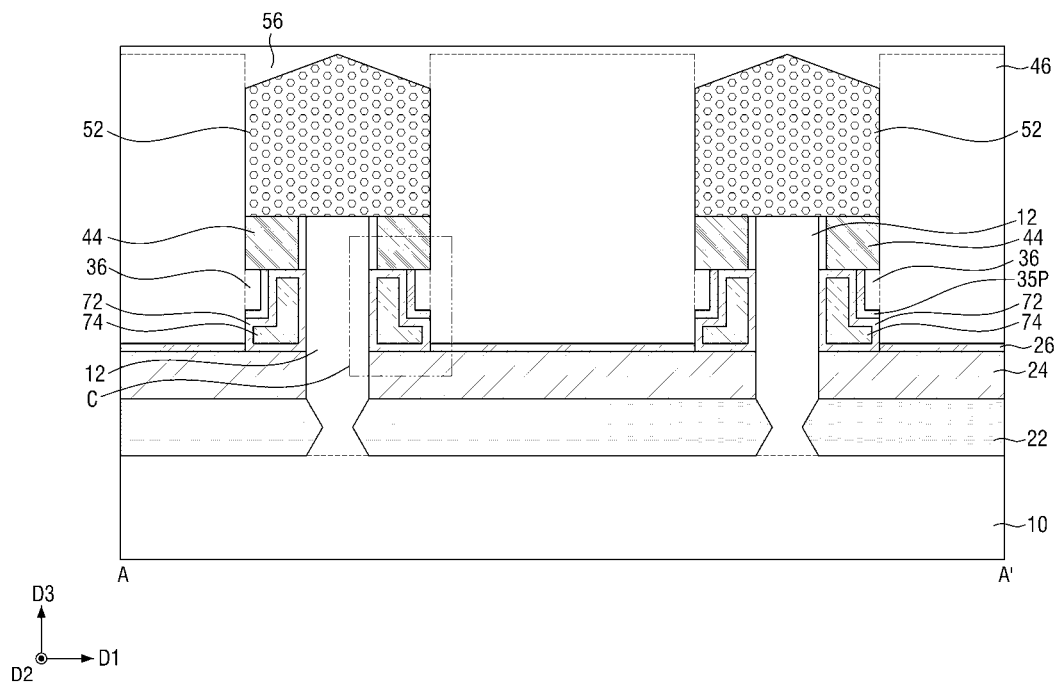
Figure 19:
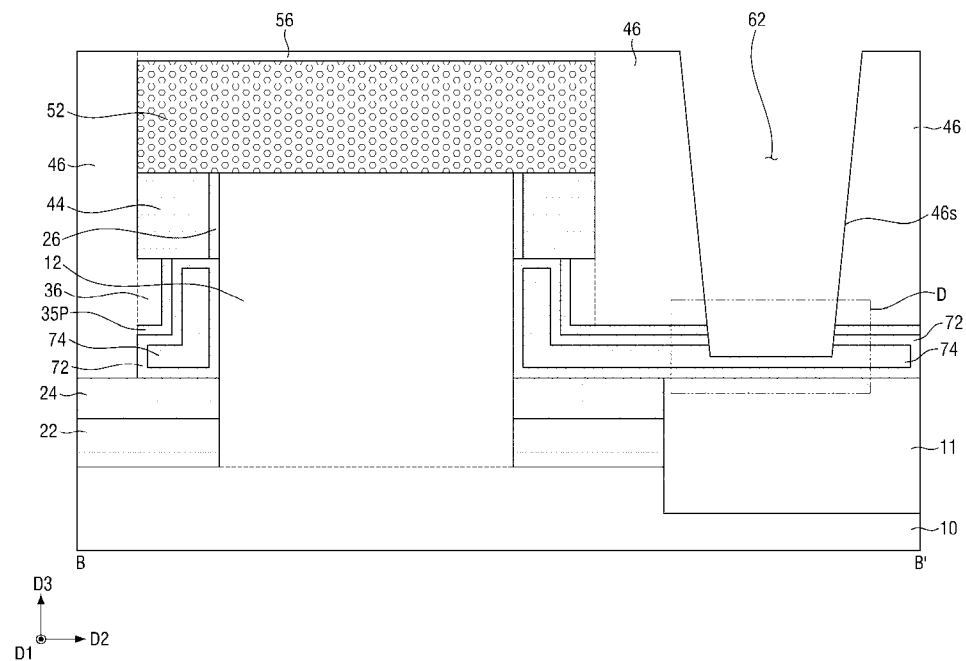
Figure 20:
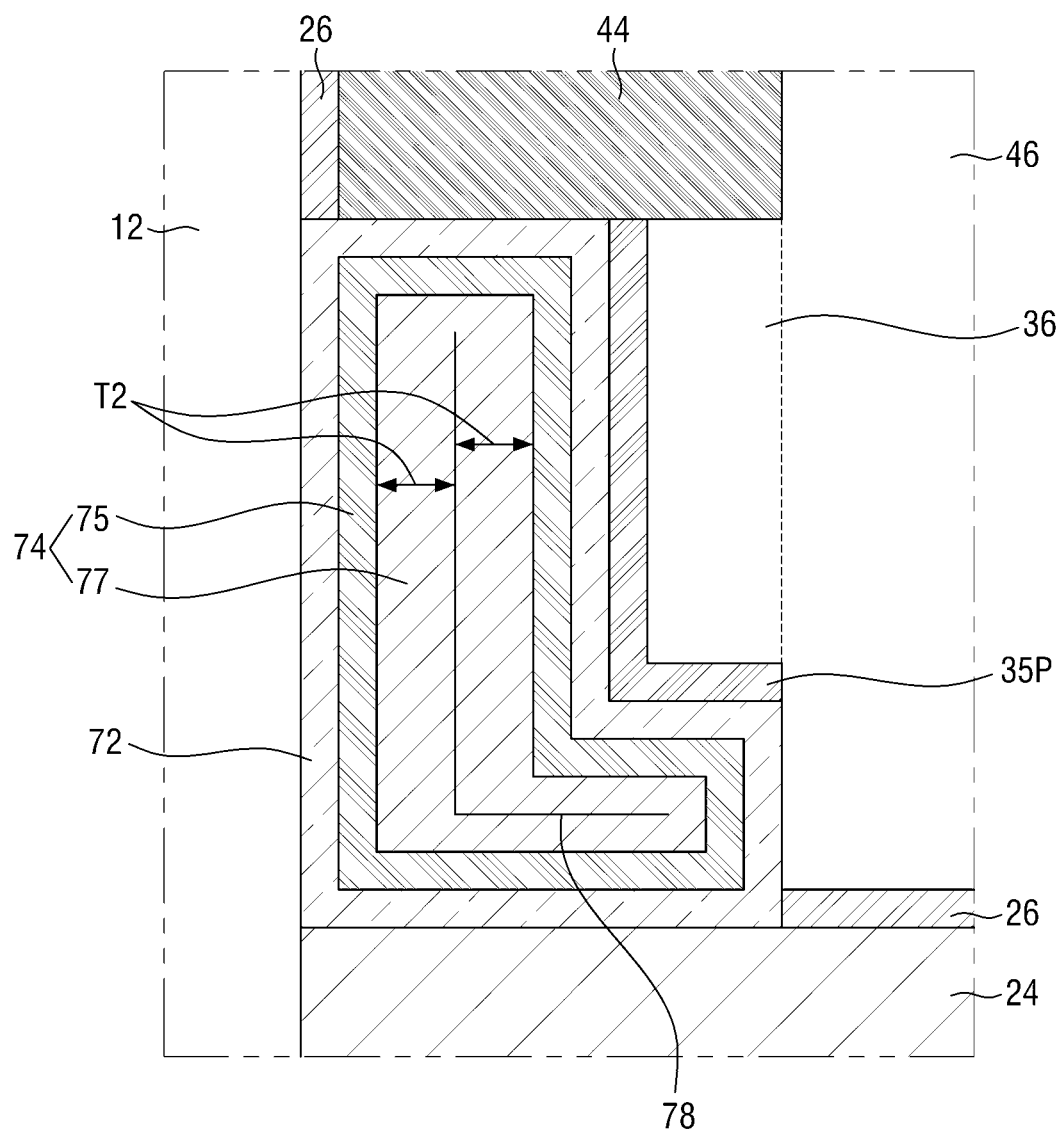
Figure 21:
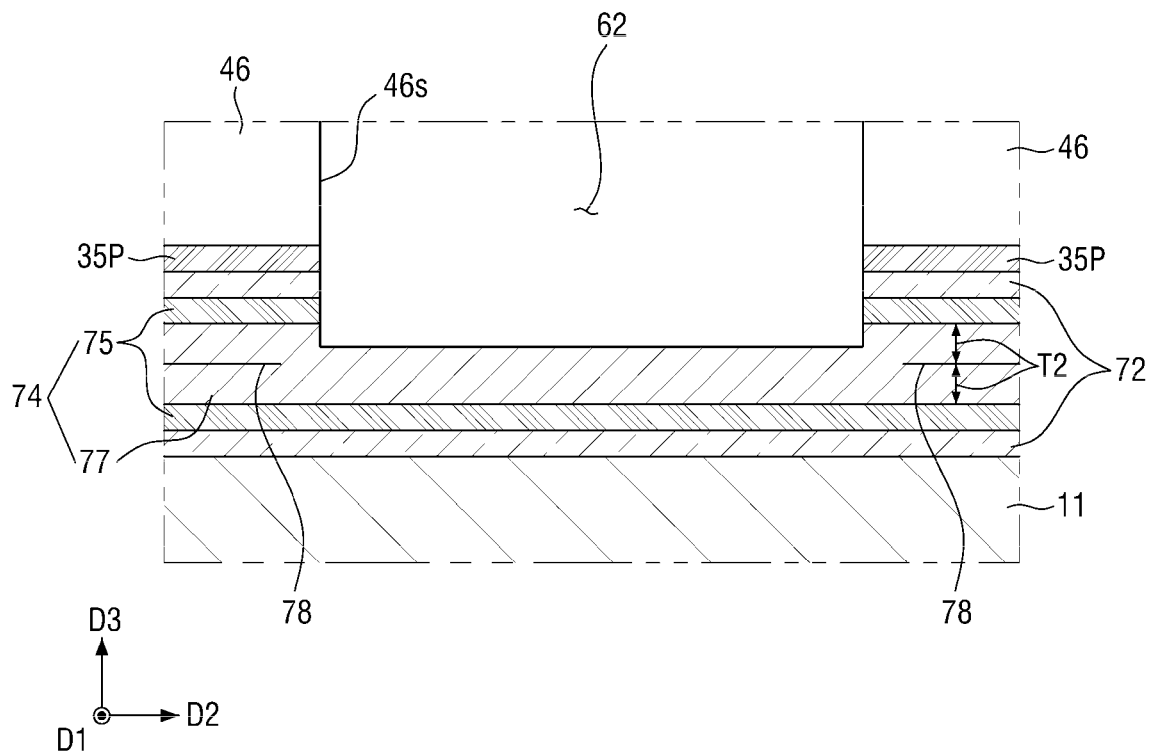
Figure 22:
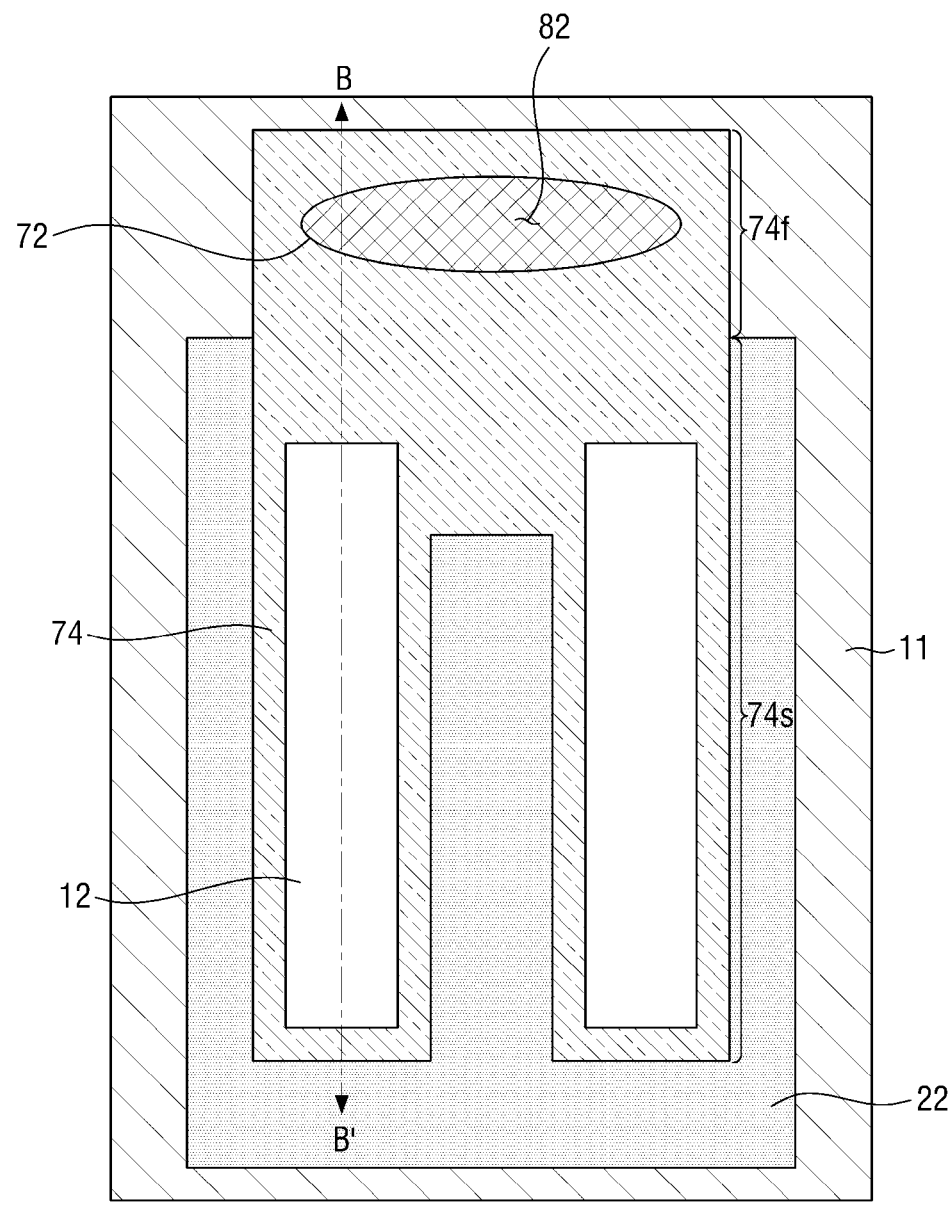
Figure 23:
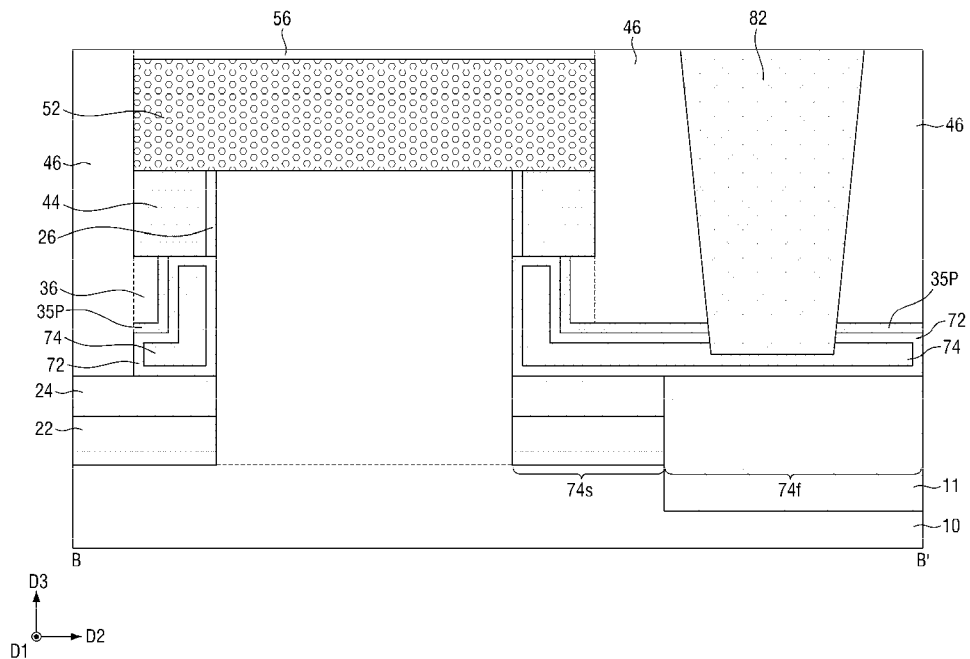

FIG. 2 is a flowchart illustrating methods of forming a VFET device according to some embodiments of the inventive concept. Specifically, FIG. 2 is the flowchart illustrating processes of forming portions of the preliminary VFET. FIGS. 3 through 11, 13 through 16, 18 through 21 and 23 are cross-sectional views illustrating methods of forming a VFET device according to some embodiments of the inventive concept, and FIGS. 12, 17, and 22 are plan views illustrating methods of forming a VFET device according to some embodiments of the inventive concept. FIGS. 13 and 18 are cross-sectional views taken along the line A-A' of FIGS. 12 and 17, respectively, and FIGS. 14 and 19 are cross-sectional views taken along the line B-B' of FIGS. 12 and 17, respectively. FIG. 23 is a cross-sectional view taken along the line B-B' of FIG. 22. FIG. 20 is an enlarged view of the region C of FIG. 18, and FIG. 21 is an enlarged view of the region D of FIG. 19.

Figure 3:
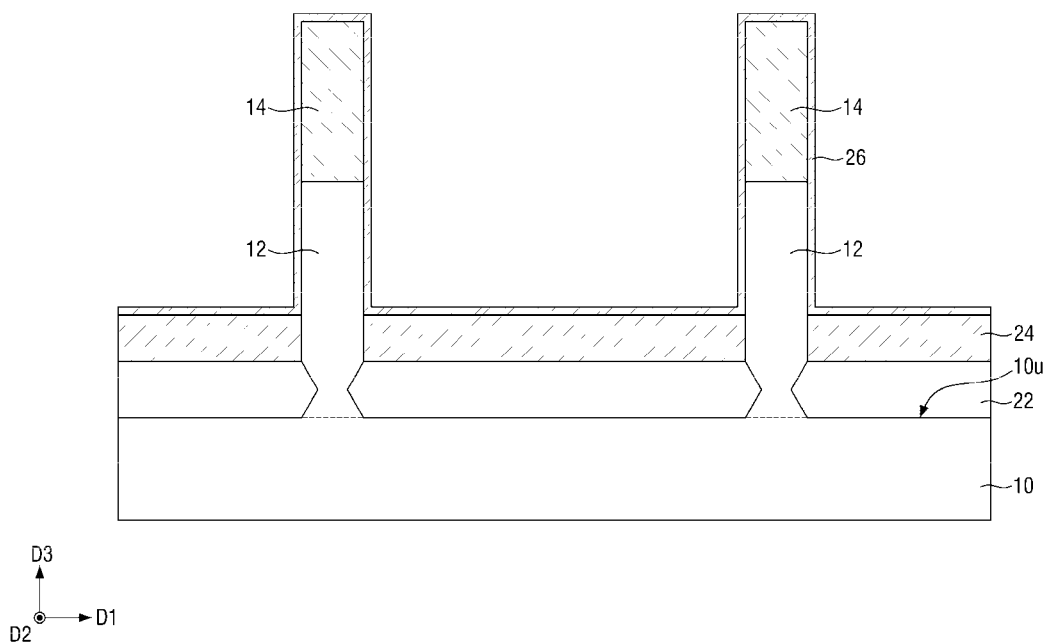
FIGS. 3 through 11, 13 through 16, 18 through 21 and 23 are cross-sectional views illustrating methods of forming a VFET device according to some embodiments of the inventive concept.

Referring to FIGS. 2 and 3, forming the preliminary VFET may include forming a bottom source/drain region 22 and a channel region 12 on a substrate 10. In some embodiments, forming the channel region 12 may include a forming a mask layer 14 on the substrate 10 (Block 110) and forming the channel region 12 (Block 120) by etching the substrate 10 using the mask layer 14 as an etch mask. For example, the mask layer 14 may be a hard mask layer including SiN and/or SiON. The channel region 12 may protrude from the substrate 10 in a third direction D3. The third direction D3 may be a vertical direction and may be perpendicular to an upper surface 10u of the substrate 10.

The substrate 10 may include one or more semiconductor materials, for example, Si, Ge, SiGe, GaP, GaAs, SiC, SiGeC and/or InP. In some embodiments, the substrate 10 may be a bulk substrate (e.g., a bulk silicon substrate) or a semiconductor on insulator (SOI) substrate. As illustrated in FIG. 3, two channel regions 12 may be formed on the substrate 10. The two channel regions 12 may be spaced apart from each other in the first horizontal direction D1. The first horizontal direction D1 may be parallel to the upper surface 10u of the substrate 10.

The bottom source/drain region 22 may be formed on the substrate 10 before or after forming the channel region 12. In some embodiments, the bottom source/drain region 22 may be formed by implanting impurity elements (e.g., B, P, and/or As) into the substrate 10. In some embodiments, the bottom source/drain region 22 may be formed by forming an epitaxial layer including impurity elements (e.g., B, P, and/or As) on the substrate 10. The epitaxial layer of the bottom source/drain region 22 may be formed by performing an epitaxial growth process using the substrate 10 as a seed layer.

A bottom spacer 24 may be formed on the bottom source/drain region 22 to electrically isolate the bottom source/drain region 22 from elements subsequently formed on the bottom source/drain region 22 (e.g., a gate electrode 74 in FIG. 18). The bottom spacer 24 may include an insulating material (e.g., silicon oxide, silicon nitride or silicon oxinitride).

As illustrated in FIG. 3, a first liner 26 may be formed on the bottom spacer 24, a side surface of the channel region 12, and a side surface and an upper surface of the mask layer 14 (Block 130 in FIG. 2). The first liner 26 may be formed to protect the channel region 12 during subsequent processes. In some embodiments, the first liner 26 may have a uniform thickness along the side surface of the channel region 12 and the side surface and the upper surface of the mask layer 14 as illustrated in FIG. 3. The first liner 26 may include a material different from the channel region 12 such that the first liner 26 can be selectively removed from the side of the channel region 12. For example, the first liner 26 may be a silicon oxide layer. Throughout the specification, removing a layer X may mean etching the layer X using a wet etch process and/or a dry etch process. Although FIG. 3 shows that the first liner 26 is a single layer, in some embodiments, the first liner 26 may include multiple stacked layers sequentially stacked on the side of the channel region 12.

Figure 4:
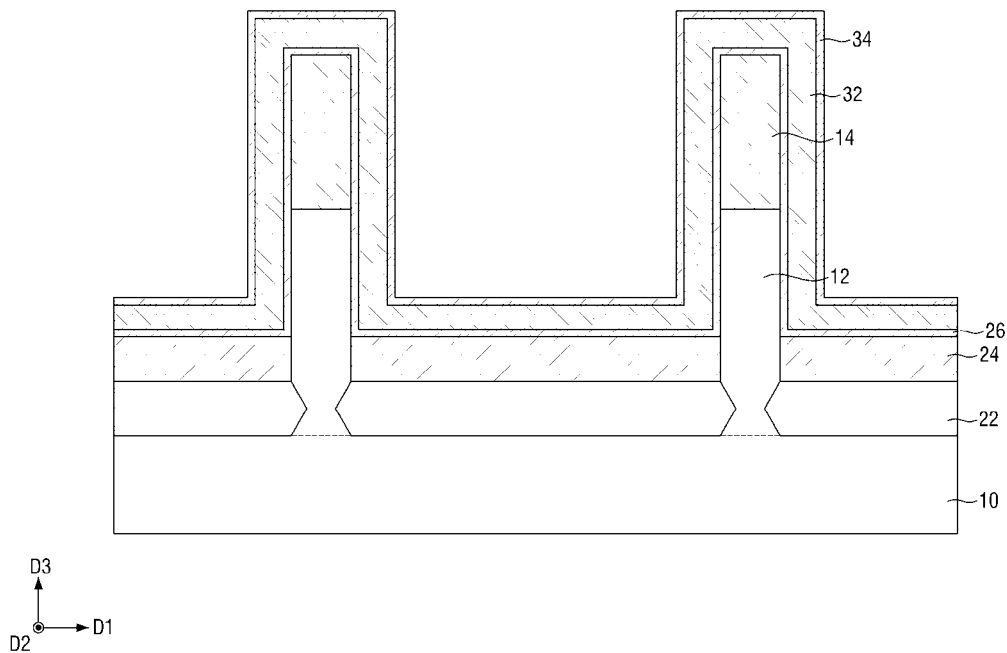

Referring to FIG. 4, the methods may include sequentially forming a preliminary sacrificial layer 32 and a preliminary second liner 34 on the first liner 26. Each of the preliminary sacrificial layer 32 and the preliminary second liner 34 may have a uniform thickness as illustrated in FIG. 4. For example, the preliminary sacrificial layer 32 may be a silicon layer (e.g., an amorphous silicon layer and/or a poly silicon layer) and/or a metallic layer (e.g., a TiN layer and/or a Ti layer). For example, the preliminary second liner 34 may be a layer including an insulating material (e.g., a silicon layer including oxygen and/or nitride).

Figure 5:
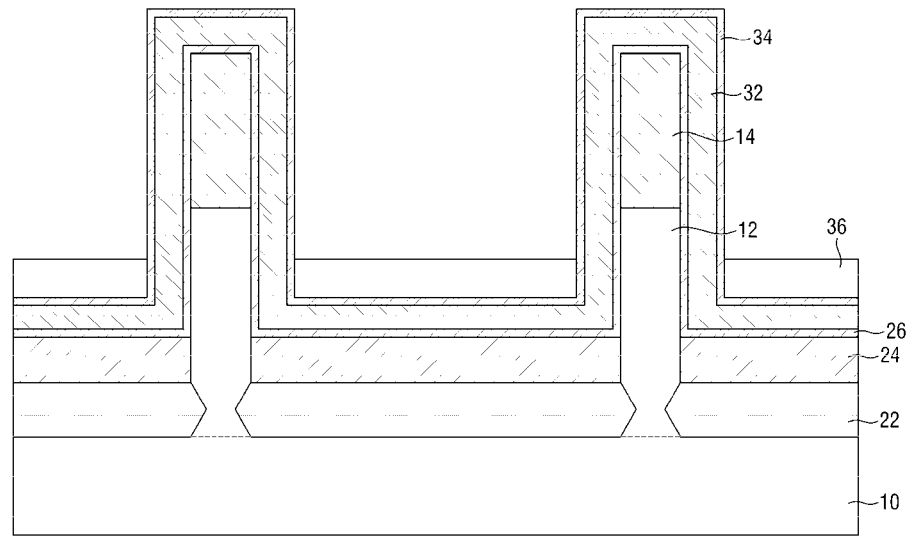

Referring to FIG. 5, the methods may further include forming a first insulating layer 36 on a lower portion of the side surface of the channel region 12. The side surface of the channel region 12 may include an upper portion and the lower portion that is between the upper portion of the channel region 12 and the substrate 10. The first insulating layer 36 may include an insulating material (e.g., a silicon layer including oxygen and/or nitride or a low dielectric layer having a dielectric constant lower than silicon dioxide). The first insulating layer 36 is formed on only the lower portion of the side surface of the channel region 12, and the first insulating layer 36 exposes portions of the preliminary sacrificial layer 32 and the preliminary second liner 34 that are above the first insulating layer 36.

Figure 6:
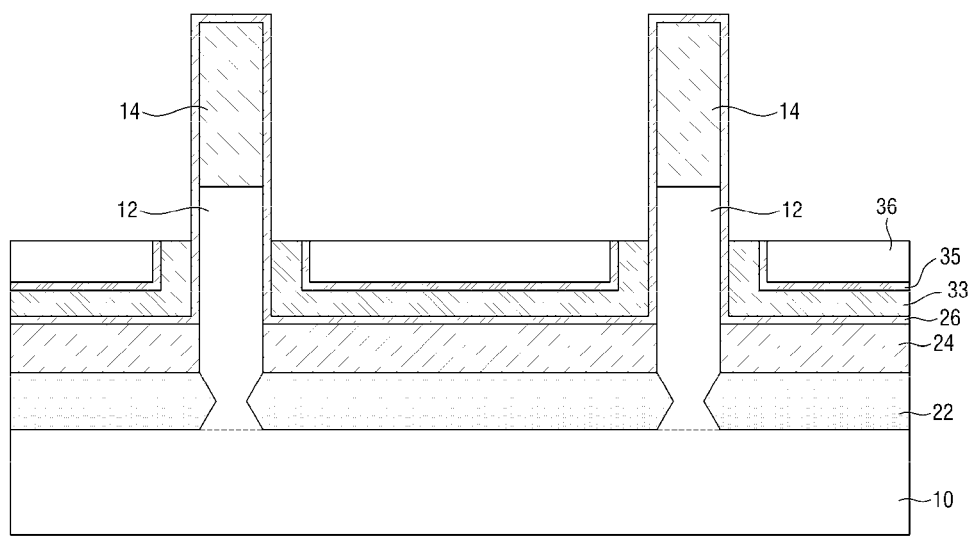

Referring to FIG. 6, the portions of the preliminary sacrificial layer 32 and the preliminary second liner 34 above the first insulating layer 36 may be removed, thereby forming a sacrificial layer 33 and a second liner 35. The sacrificial layer 33 and the second liner 35 may be formed on the lower portion of the side surface of the channel region 12 as illustrated in FIG. 6. In some embodiments, the portions of the preliminary sacrificial layer 32 and the preliminary second liner 34 above the first insulating layer 36 may be removed until the underlying first liner 26 is exposed. A portion of the channel region 12 and the mask layer 14 may protrude in the third direction D3 beyond upper surfaces of the sacrificial layer 33 and the second liner 35 as illustrated in FIG. 6.

Figure 7:
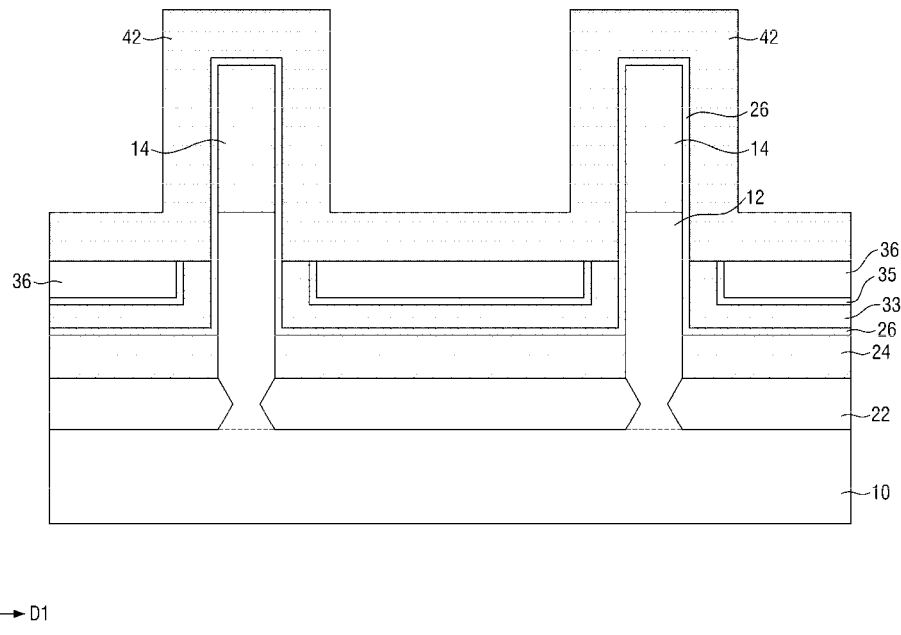

Referring to FIG. 7, a top spacer layer 42 may be formed on the mask layer 14, the sacrificial layer 33, the second liner 35, and the first insulating layer 36. The top spacer layer 42 may directly contact the first liner 26 and upper surfaces of the sacrificial layer 33, the second liner 35, and the first insulating layer 36 as illustrated in FIG. 7. In some embodiments, the top spacer layer 42 may have a uniform thickness along the mask layer 14 as illustrated in FIG. 7. For example, the top spacer layer 42 may include an insulating material (e.g., silicon oxide, silicon nitride and/or silicon oxinitride). In some embodiments, the top spacer layer 42 may be a SiN layer. In some embodiments, the top spacer layer 42 may be multiple stacked layers.

Figure 8:
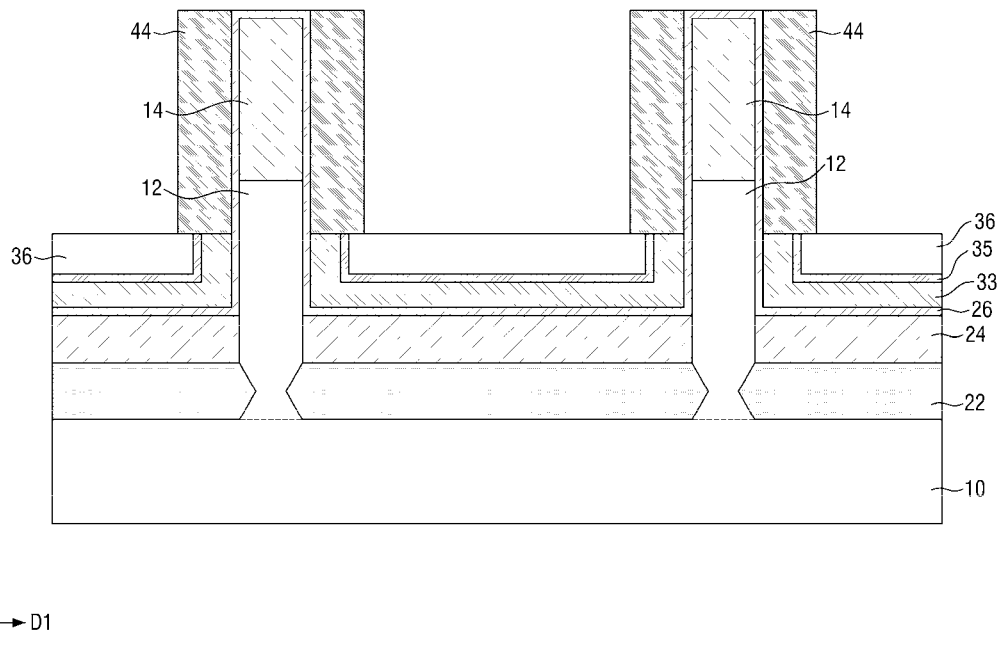

Referring to FIG. 8, portions of the top spacer layer 42 may be removed until the underlying first insulating layer 36 is exposed. Portions of the top spacer layer 42 that are on the upper surface of the mask layer 14 may also be removed, thereby forming a top spacer 44. In some embodiments, the top spacer 44 may overlap the upper surface of the sacrificial layer 33 and the second liner 35 as illustrated in FIG. 8.

Figure 9:
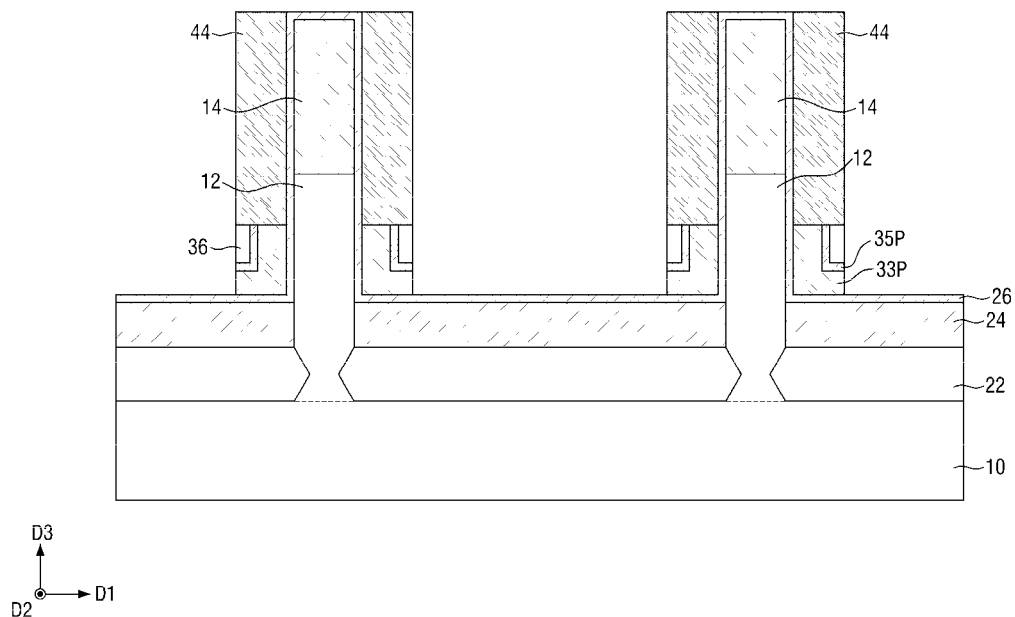

Referring to FIG. 9, portions of the first insulating layer 36, the second liner 35, and the sacrificial layer 33 may be removed using the mask layer 14, the first liner 26, the top spacer 44 collectively as an etch mask as illustrated in FIG. 9, thereby forming a patterned sacrificial layer 33p and a patterned second liner 35p. The first insulating layer 36, the second liner 35, and the sacrificial layer 33 may be removed until a portion of first liner 26 extending on the bottom spacer 24 is exposed. In some embodiments, a portion of the first insulating layer 36 may remain on a side of the patterned second liner 35p as illustrated in FIG. 9.

Figure 10:
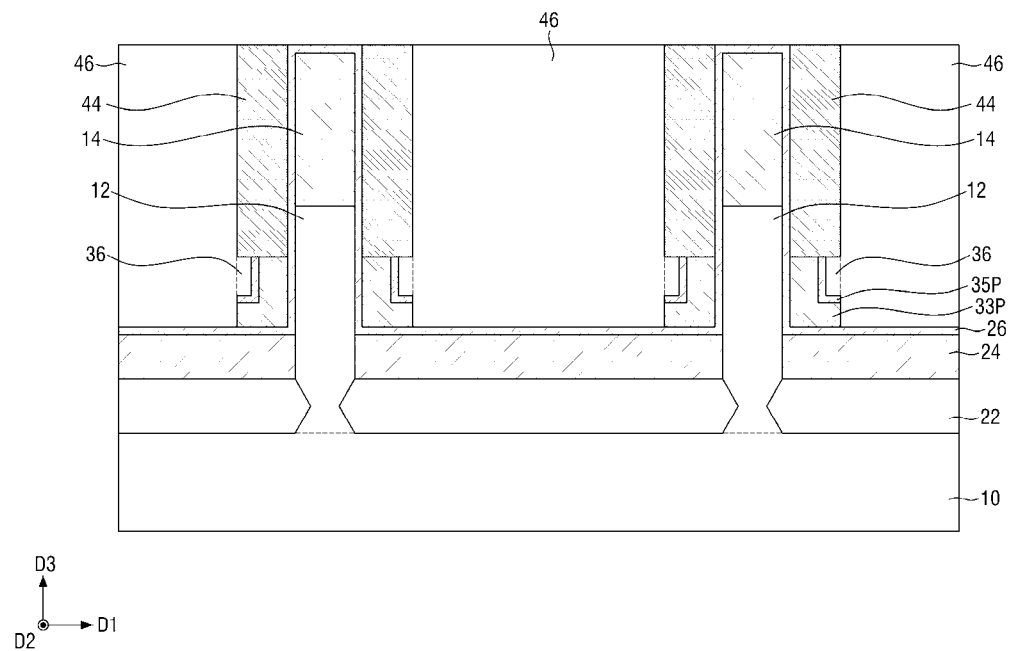

Referring to FIG. 10, a second insulating layer 46 may be formed on the substrate 10. The top spacer 44, the patterned sacrificial layer 33p, and the patterned second liner 35p may be in the second insulating layer 46. The portion of the first insulating layer 36 on the side of the patterned second liner 35p and the second insulating layer 46 may be referred to collectively as an insulating layer. The second insulating layer 46 may include an insulating material (e.g., a silicon layer including oxygen and/or nitride or a low dielectric layer). In some embodiments, the second insulating layer 46 and the first insulating layer 36 may include the same material, and an interface between the second insulating layer 46 and the first insulating layer 36 may not be visible. In some embodiments, an upper surface of the second insulating layer 46 and upper surfaces of the top spacer 44 and the mask layer 14 may be coplanar with each other as illustrated in FIG. 10.

Figure 11:
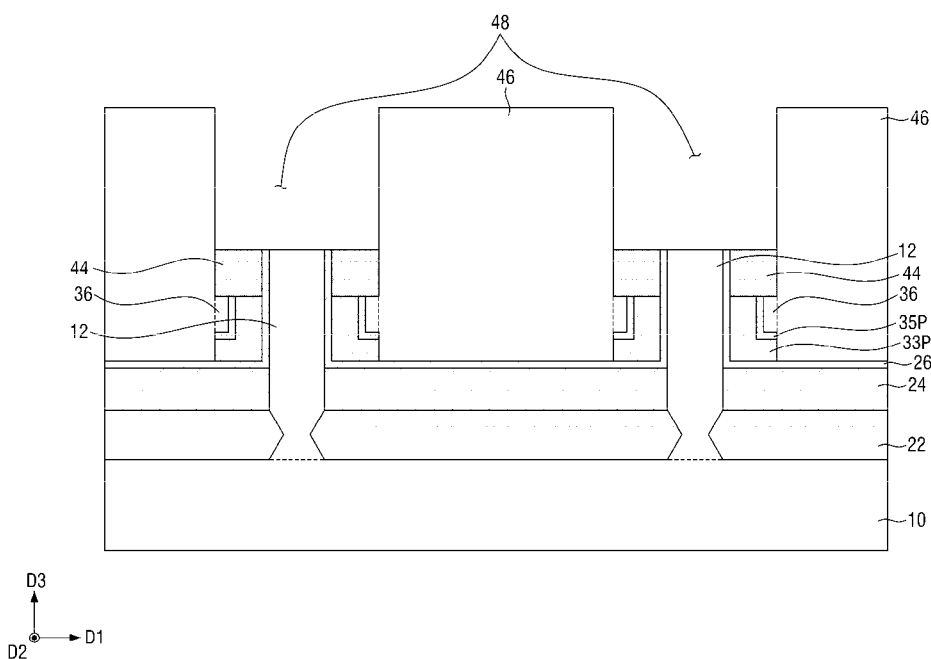
Figure 12:
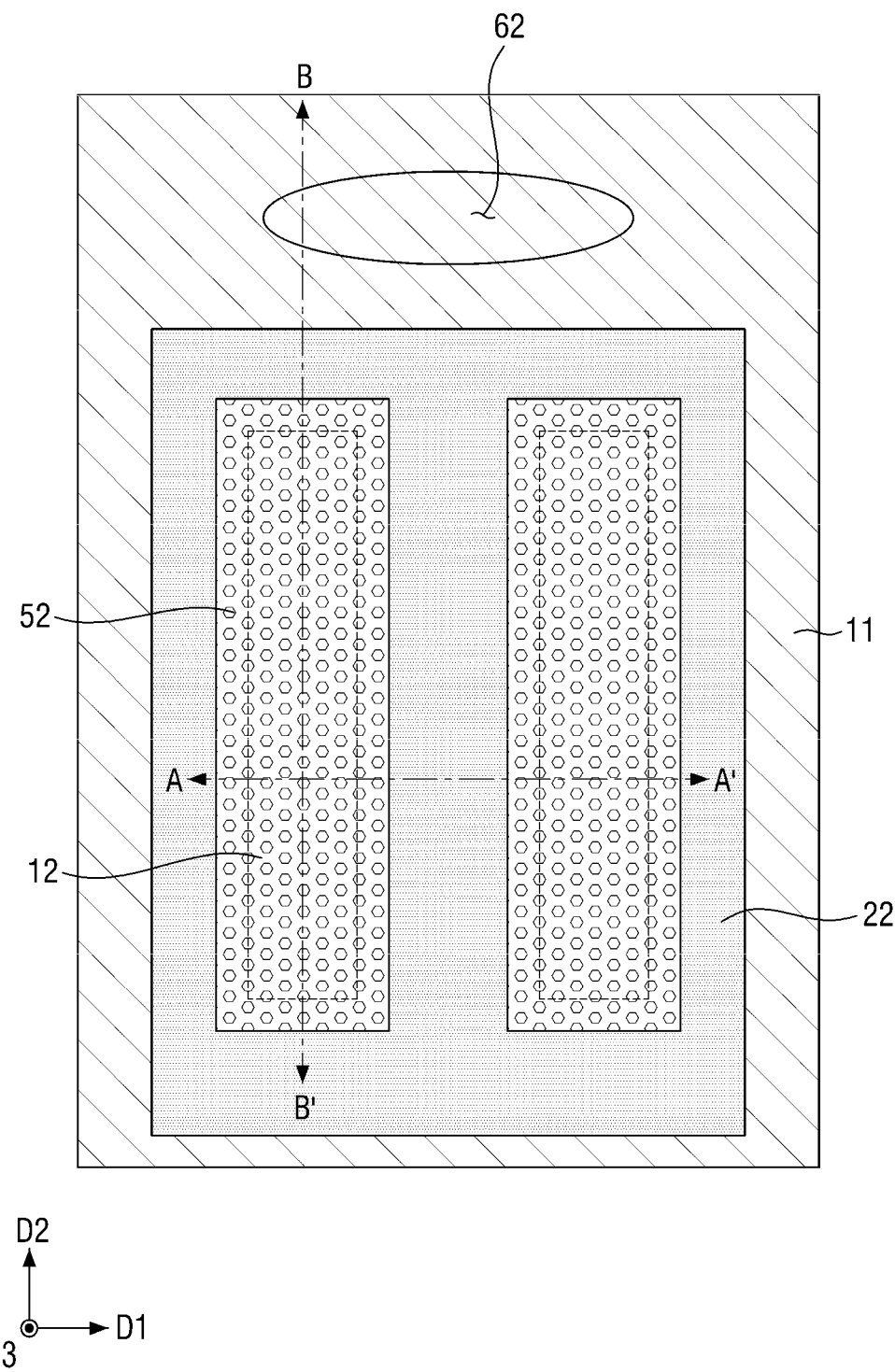
FIGS. 12, 17, and 22 are plan views illustrating methods of forming a VFET device according to some embodiments of the inventive concept.

Referring to FIG. 11, portions of the top spacer 44, the mask layer 14 and portions of the first liner 26 above the channel region 12 may be removed, thereby forming a top source/drain opening 48 in the second insulating layer 46. A portion of the second insulating layer 46 defines the top source/drain opening 48 above the channel region 12 as illustrated in FIG. 9. The top source/drain opening 48 may expose the top spacer 44 and the channel region 12. After forming the top source/drain opening 48, the first liner 26 may remain between the top spacer 44 and the channel region 12 and may separate the top spacer 44 from the channel region 12.

Referring to FIGS. 12 and 13, a top source/drain region 52 may be formed in the top source/drain opening 48. For simplicity of illustration, FIG. 12 does not show all elements shown in FIGS. 13 and 14. For example, the top source/drain region 52 may be formed by performing an epitaxial growth process using the channel region 12 as a seed layer. An epitaxial growth process for forming the top source/drain region 52 may be performed at a high temperature (e.g., from about 400° C. to about 700° C.). The top source/drain region 52 may contact the underlying the top spacer 44 and the channel region 12. In some embodiments, a third insulating layer 56 may be formed in the top source/drain opening 48 on the top source/drain region 52. As the top source/drain region 52 is formed in the top source/drain opening 48, a patterning process to pattern the top source/drain region 52 may not be performed.

Referring to FIGS. 12 and 14, the bottom source/drain region 22 may be formed in a field isolation layer 11. In some embodiments, the bottom source/drain region 22 may be an upper portion of an active region formed on the substrate 10. Accordingly, the active region may be on a side surface of the field isolation layer 11, and the field isolation layer 11 may enclose the active region. Each of the channel regions 12 may extend longitudinally in a second horizontal direction D2. The second horizontal direction D2 may be parallel to the upper surface of the substrate (e.g., 10u in FIG. 3). In some embodiments, the second horizontal direction D2 may be perpendicular to the first horizontal direction D1. In some embodiments, the field isolation layer 11 may enclose the bottom source/drain region 22 as illustrated in FIG. 12.

A contact opening 62 may be formed to extend through the second insulating layer 46. The contact opening 62 may also extend through portions of the patterned sacrificial layer 33p and the patterned second liner 35p that extend on the field isolation layer 11. In some embodiments, a portion of the first liner 26 extending on the field isolation layer 11 may be removed while forming the contact opening 62, and the contact opening 62 may expose the field isolation layer 11 as illustrated in FIG. 14. In some embodiments, a portion of the first liner 26 extending on the field isolation layer 11 may not be removed while forming the contact opening 62, and the contact opening 62 may expose the portion of the first liner 26 extending on the field isolation layer 11.

The contact opening 62 may overlap the field isolation layer 11 and may be spaced apart from the channel region 12 in the second horizontal direction D2. The patterned sacrificial layer 33p may have a first thickness T1 on the side of the channel region 12 and may also have the first thickness T1 on the field isolation layer 11 as illustrated in FIG. 14.

Figure 15:
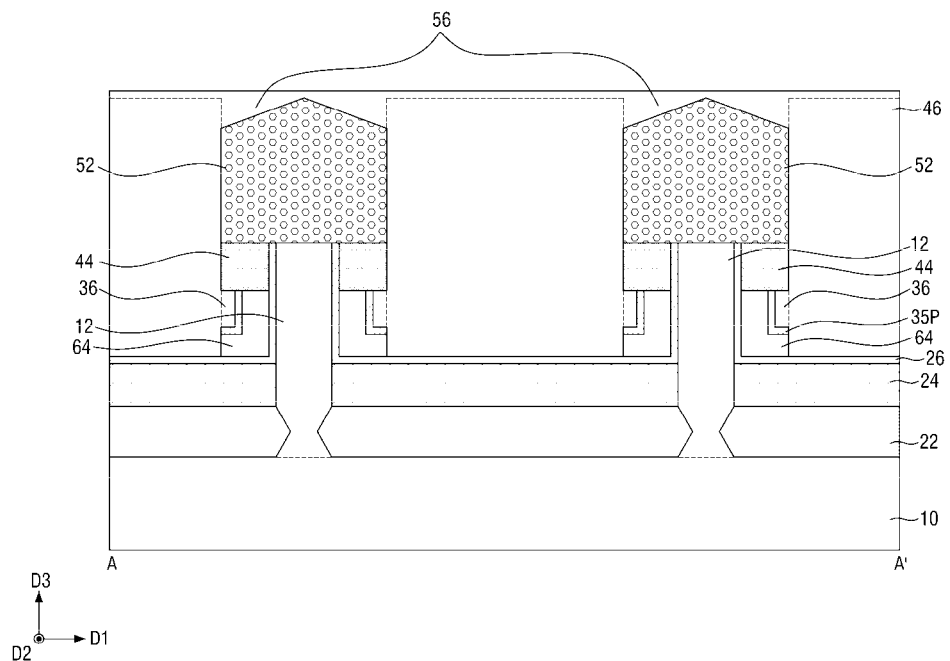
Figure 16:
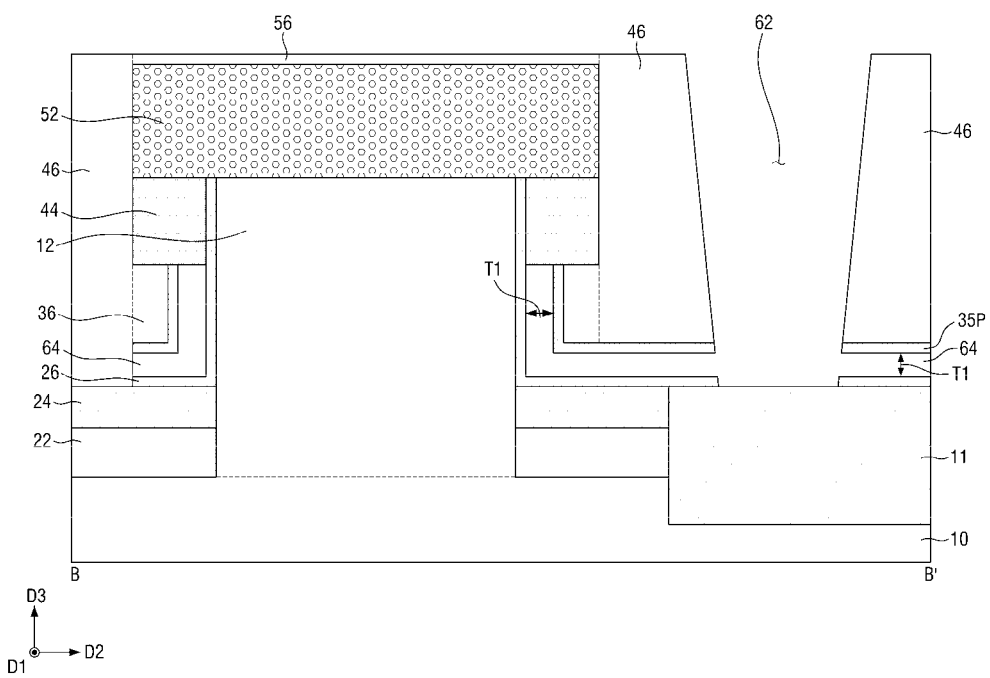

Referring to FIGS. 15 and 16, the patterned sacrificial layer 33p may be removed through the contact opening 62, thereby forming a cavity 64 between the channel region 12 and the second insulating layer 46. For example, an etchant removing the patterned sacrificial layer 33p may be supplied through the contact opening 62. In some embodiments, the cavity 64 may be defined by the first liner 26, the patterned second liner 35p, and the second insulating layer 46.

Referring to FIG. 16, the cavity 64 may include a portion extend onto the field isolation layer 11. The etchant removing the patterned sacrificial layer 33p may not remove the first liner 26 extending on the channel region 12 such that the channel region 12 may be protected by the first liner 26 while removing the patterned sacrificial layer 33p. The cavity 64 may have a width that is equal to the first thickness T1 of the patterned sacrificial layer 33p. The cavity 64 may be connected to the contact opening 62.

Referring to FIGS. 17, 18, and 19, a gate dielectric 72 and a gate electrode 74 may be sequentially formed in the cavity 64 through the contact opening 62. For simplicity of illustration, FIG. 17 does not show all elements shown in FIGS. 18 and 19. Each of the gate dielectric 72 and the gate electrode 74 may be formed by performing an atomic layer deposition (ALD) process. The gate dielectric 72 may be formed conformally in the cavity 64 as illustrated in FIGS. 18 and 19. The gate dielectric 72 may have a uniform thickness as illustrated in FIGS. 18 and 19. In some embodiments, the gate dielectric 72 may enclose the gate electrode 74 in a cross-sectional view as illustrated in FIG. 18. The gate dielectric 72 may include silicon oxide and/or a high-k material (e.g., hafnium oxide or aluminum oxide).

The gate electrode 74 may be formed in the cavity 64. For example, the gate electrode 74 may include a metallic layer (e.g., W, Ti, Cu, and/or Co). After forming the gate electrode 74, a portion of the first liner 26 may still be between the top spacer 44 and the channel region 12.

FIG. 20 is an enlarged view of the region C of FIG. 18. Referring to FIG. 20, the gate electrode 74 may include a work function layer 75 and a metallic electrode 77. The work function layer 75 and the metallic electrode 77 may be sequentially formed on the gate dielectric 72. In some embodiments, the work function layer 75 may enclose the metallic electrode 77 in a cross-sectional view as illustrated in FIG. 20. The work function layer 75 may be used to tune a work function of the gate electrode 74 and may include metal nitride (e.g., TiN, TiAlN, TaAlN), TiAl, TaC, TiC, or HfSi. Although FIG. 20 shows that the work function layer 75 is a single layer, the work function layer 75 may be multiple stacked layers. The work function layer 75 may have a uniform thickness along a surface of the gate dielectric 72 as illustrated in FIG. 20.

The metallic electrode 77 may include metal (e.g., Al, W, and/or Cu). In some embodiments, the metallic electrode 77 may be formed by repetitively depositing an atomic layer on a surface of the work function layer 75 until the metallic electrode 77 has a second thickness T2. The metallic electrode 77 may include a seam 78 that is spaced apart from the surface of the work function layer 75 by a uniform distance (i.e., the second thickness T2). In some embodiments, the seam 78 of the metallic electrode 77 may be visible.

FIG. 21 is an enlarged view of the region D of FIG. 19. Referring to FIG. 19, the gate dielectric 72 may have portions spaced apart from each other in the third direction D3, and the gate electrode 74 may be formed between those portions of the gate dielectric 72. The seam 78 of the metallic electrode 77 may be spaced apart the work function layer 75 by a uniform distance (i.e., the second thickness T2).

In some embodiments, the gate dielectric 72 and the gate electrode 74 may be formed on a side surface 46s of the second insulating layer 46, which defines the contact opening 62, and then may be removed.

For simplicity of illustration, FIG. 22 also does not show all elements shown in FIG. 23. Referring to FIGS. 22 and 23, the gate electrode 74 may include a self-aligned portion 74s formed on the bottom source/drain region 22 and a field gate portion 74f extending on the field isolation layer 11. A gate contact 82 may be formed in the contact opening 62. The gate contact 82 may overlap the field isolation layer 11 and may contact the field gate portion 74f of the gate electrode 74. In some embodiments, the gate dielectric 72 may enclose a lower portion of the gate contact 82 in a plan view as illustrated in FIG. 22, and the lower portion of the gate contact 82 may be in the gate electrode 74 as illustrated in FIG. 23. The gate contact 82 may include a conductive material (e.g., a doped semiconductor material and/or a metallic material).

In some embodiments, a gate voltage may be applied to the gate electrode 74 through the gate contact 82 while the VFET device is operating. The gate contact 82 may electrically connect the gate electrode 74 to a word line of the VFET device.

Figure 24:
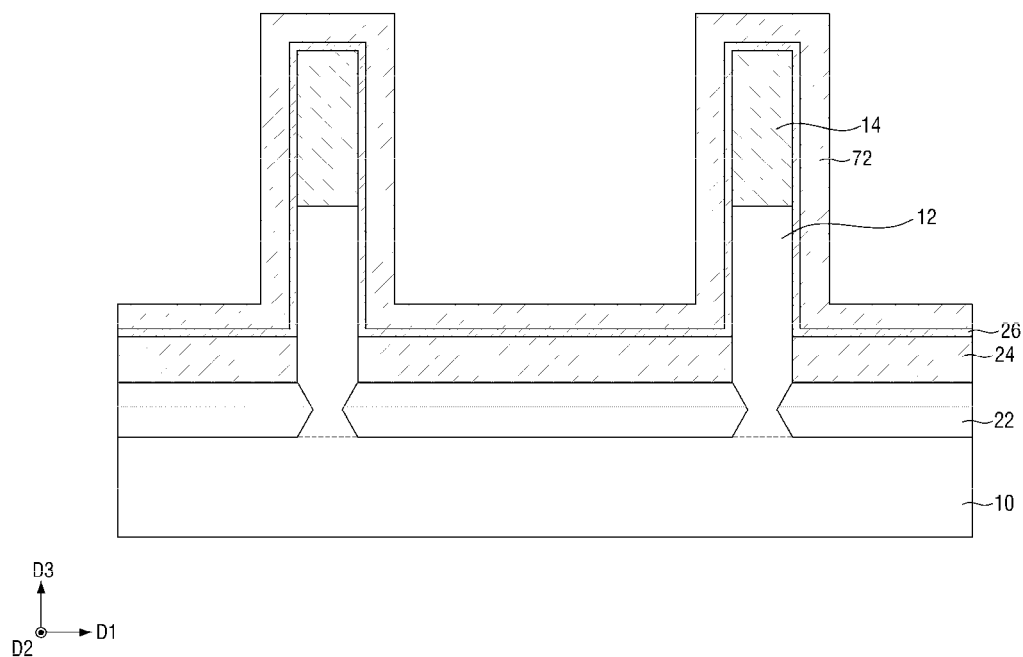
FIGS. 24 through 28 are cross-sectional views illustrating methods of forming a VFET device according to some embodiments of the inventive concept.
Figure 25:
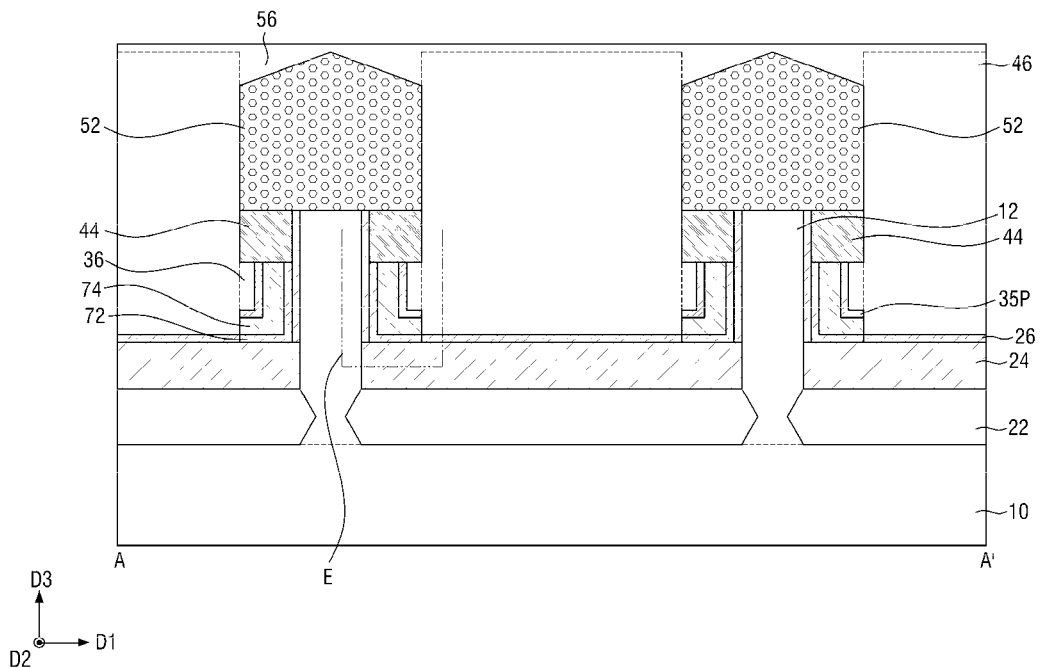
Figure 26:
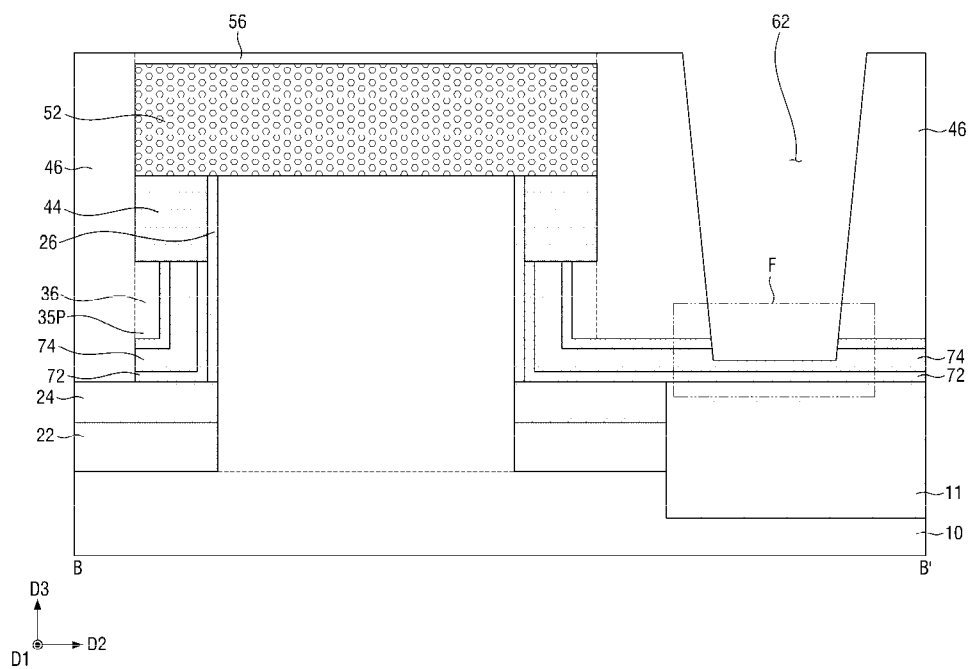

FIGS. 24 through 28 are cross-sectional views illustrating methods of forming a VFET device according to some embodiments of the inventive concept. Referring to FIG. 24, in some embodiments, a gate dielectric 72 may be formed before a preliminary sacrificial layer (e.g., a preliminary sacrificial layer 32 in FIG. 4) and a preliminary second liner (e.g., a preliminary second liner 34 in FIG. 4) are formed. Processes similar to those described with reference to FIGS. 4 through 19 may be performed after the gate dielectric 72 is formed, thereby forming structures shown in FIGS. 25 and 26. FIGS. 25 and 26 are views corresponding to FIGS. 18 and 19.

Referring to FIG. 25, the gate dielectric 72 may not enclose the gate electrode 74. The gate dielectric 72 may be disposed between the channel region 12 and the gate electrode 74 and between the bottom spacer 24 and the gate electrode 74. The gate dielectric 72 may be absent, however, from other surface of the gate electrode 74. In some embodiments, the first liner 26 may be between the channel region 12 and the gate dielectric 72 and between the bottom spacer 24 and the gate dielectric 72 as illustrated in FIG. 25. Referring to FIG. 26, the contact opening 62 may not extend through a portion of the gate dielectric 72.

Figure 27:
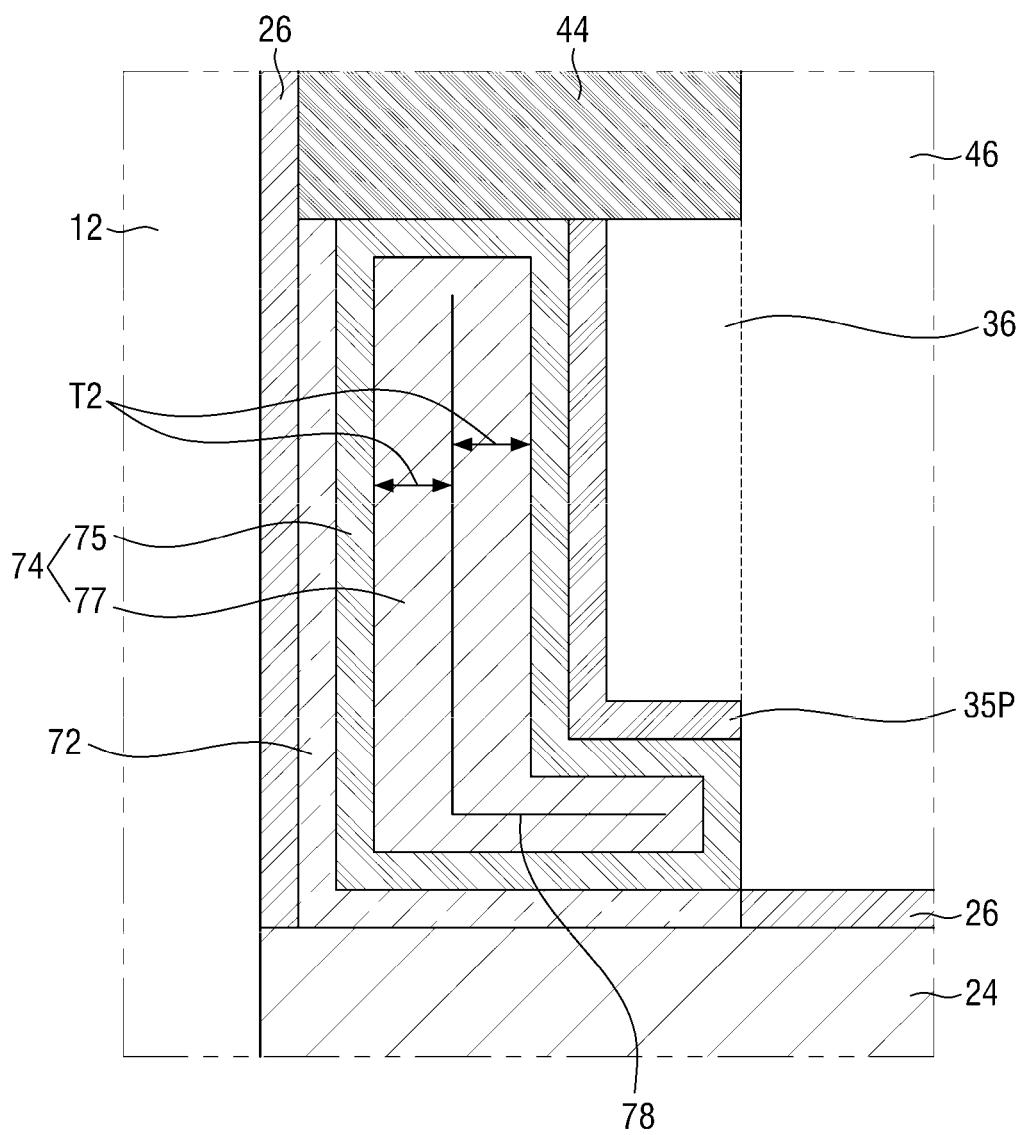
Figure 27:
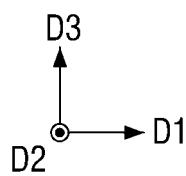
Figure 28:
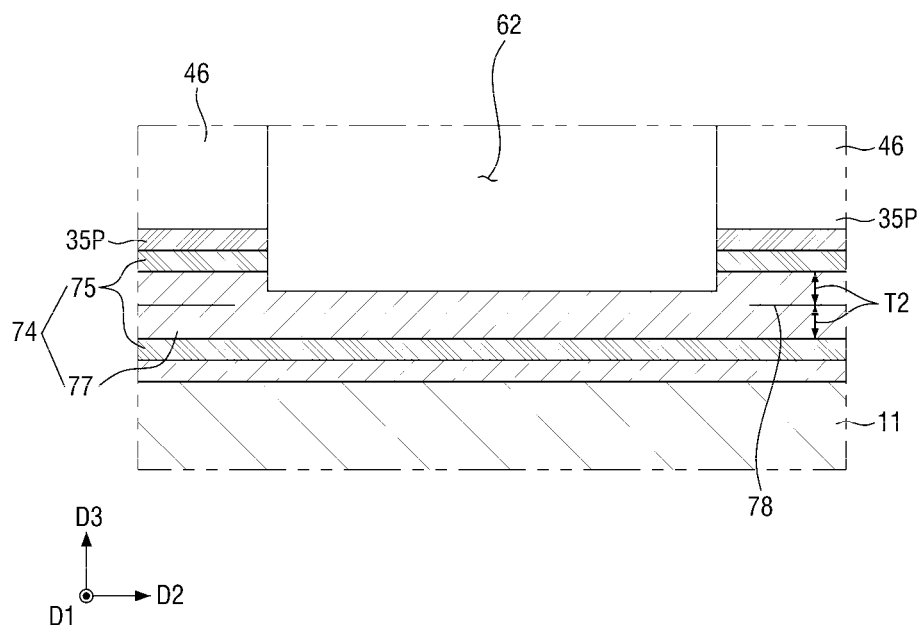
Figure 29:
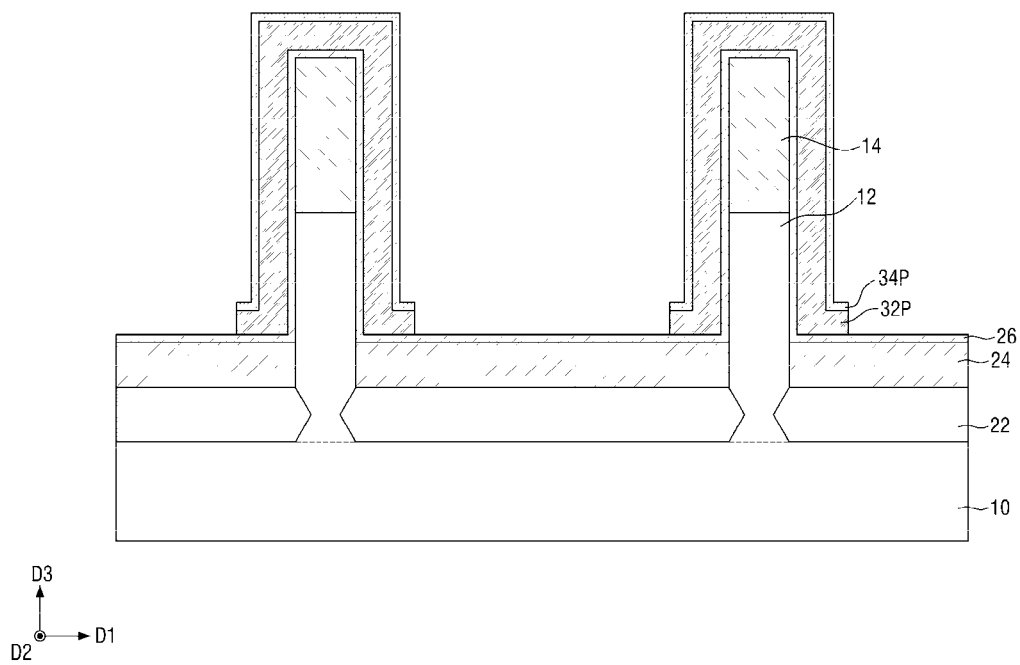
FIGS. 29 through 33 are cross-sectional views illustrating methods of forming a VFET device according to some embodiments of the inventive concept.

FIG. 27 is an enlarged view of the region E of FIG. 25, and FIG. 28 is an enlarged view of the region F of FIG. 26. The gate electrode 74 may include the work function layer 75 and the metallic electrode 77. The work function layer 75 may enclose the metallic electrode 77 as illustrated in FIG. 27. The metallic electrode 77 may be formed to have the second thickness T2, and the seam 78 may be formed to be spaced apart from the work function layer 75 in the first horizontal direction D1 by a uniform distance (e.g., the second thickness T2). A portion of the metallic electrode 77 that extends on the field isolation layer 11 may be formed to have the second thickness T2 and the seam 78 may be formed to be spaced apart from the work function layer 75 by a uniform distance (e.g., the second thickness T2) in the third direction D3.

FIGS. 29 through 33 are cross-sectional views illustrating methods of forming a VFET device according to some embodiments of the inventive concept. Referring to FIGS. 29 through 33, a preliminary sacrificial layer (e.g., a preliminary sacrificial layer 32 in FIG. 4) and a preliminary second liner (e.g., a preliminary second liner 34 in FIG. 4) may be patterned before forming a first insulating layer (e.g., a first insulating layer 36 in FIG. 5), thereby forming a patterned preliminary sacrificial layer 32p and a patterned preliminary second liner 34p. The preliminary sacrificial layer and the preliminary second liner may be patterned using a mask pattern (e.g., a photoresist pattern) as an etch mask.

Figure 30:
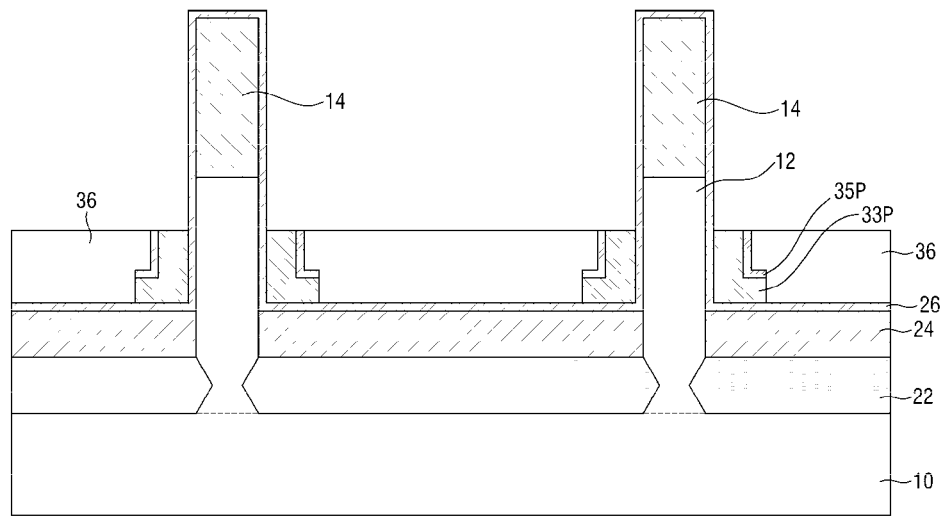

Referring to FIG. 30, the first insulating layer 36 may be formed on the patterned preliminary sacrificial layer 32p and the patterned preliminary second liner 34p and then portions of the patterned preliminary sacrificial layer 32p and the patterned preliminary second liner 34p above the first insulating layer 36 may be removed, thereby forming the patterned sacrificial layer 33p, and the patterned second liner 35p.

Figure 31:
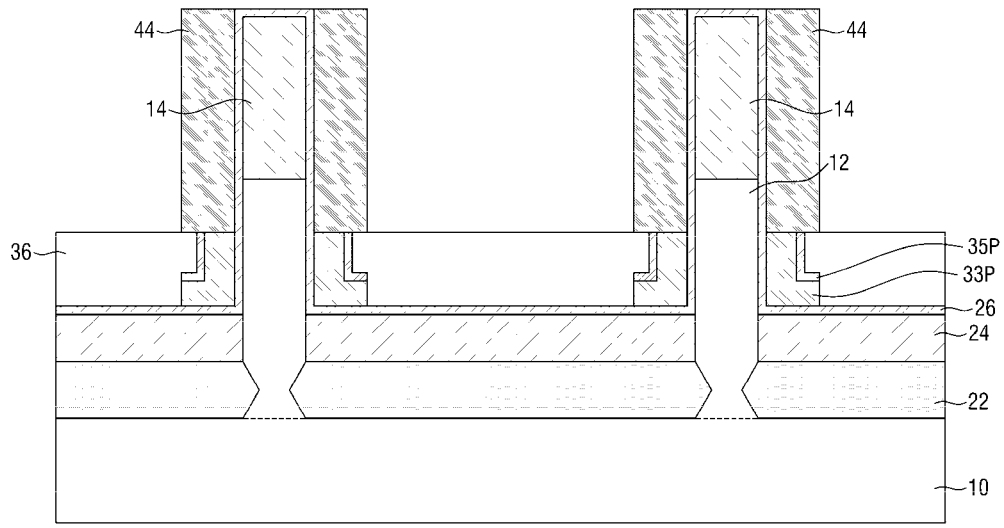
Figure 32:
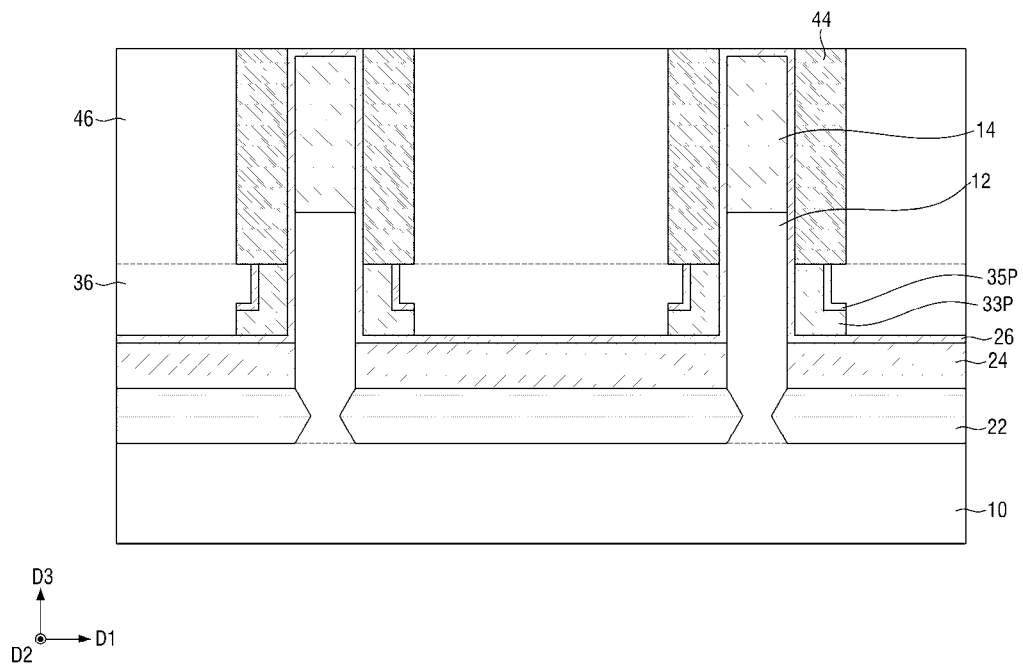
Figure 33:
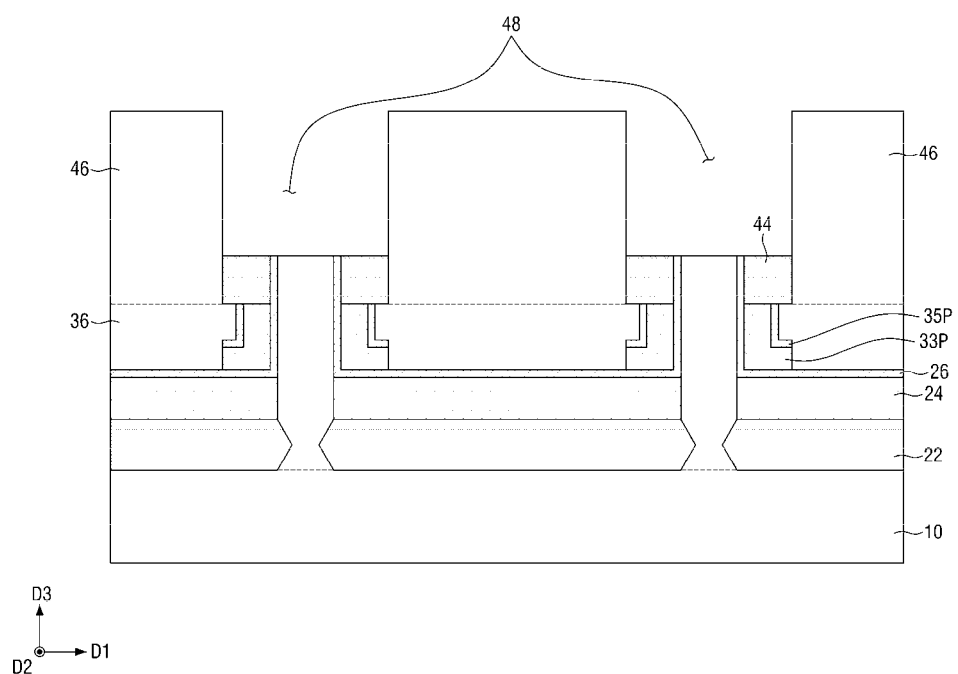

Referring to FIGS. 31 through 33, processes similar to those described with reference to FIGS. 8, 10 and 11 may be performed. The first insulating layer 36 and the second insulating layer 46 may be sequentially stacked on the bottom spacer 24 as illustrated in FIG. 33. The first insulating layer 36 and the second insulating layer 46 may be collectively referred to as an insulating layer.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of forming a vertical field-effect transistor (VFET) device, the method comprising:
    forming a preliminary VFET on a substrate, wherein the preliminary VFET comprises:
        a bottom source/drain region on the substrate;
        a channel region on the bottom source/drain region;
        a top source/drain region on the channel region, wherein the bottom source/drain region, the channel region, and the top source/drain region are sequentially stacked on the substrate;
        a patterned sacrificial layer on a side surface of the channel region;
        a top spacer that separates the patterned sacrificial layer from the top source/drain region;
        a first liner separating the channel region from the patterned sacrificial layer and the top spacer; and
        an insulating layer, wherein the top source/drain region and the patterned sacrificial layer are enclosed by the insulating layer;
    forming a contact opening extending through the insulating layer, wherein the contact opening is in the insulating layer and exposes a portion of the patterned sacrificial layer;
    forming a cavity between the channel region and the insulating layer by removing the patterned sacrificial layer through the contact opening; and
    forming a gate electrode in the cavity.

2. The method of claim 1, further comprising forming a gate contact in the contact opening after forming the gate electrode, wherein the gate contact contacts the gate electrode.

3. The method of claim 2, further comprising forming an active region and a field isolation layer on the substrate,
    wherein the active region is on a side surface of the field isolation layer, and the channel region is formed on the active region, and the gate contact overlaps the field isolation layer.

4. The method of claim 1, further comprising forming a gate dielectric in the cavity before forming the gate electrode in the cavity,
    wherein the gate dielectric encloses the gate electrode in a cross-sectional view.

5. The method of claim 1, wherein forming the gate electrode comprises sequentially forming a work function layer and a metallic electrode in the cavity,
    wherein the work function layer encloses the metallic electrode in a cross-sectional view.

6. The method of claim 1, wherein the first liner comprises a silicon oxide layer.

7. The method of claim 1, wherein forming the preliminary VFET comprises:
    forming a mask layer on the substrate;
    forming the channel region by etching the substrate using the mask layer as an etch mask;
    forming the first liner extending on the side surface of the channel region and on a side surface and an upper surface of the mask layer; and then
    forming the patterned sacrificial layer on a lower portion of the side surface of the channel region and forming the top spacer on an upper portion of the side surface of the channel region, wherein the first liner separates the channel region from the patterned sacrificial layer and the top spacer.

8. The method of claim 1, wherein forming the preliminary VFET comprises:
    forming the bottom source/drain region and the channel region on the substrate;
    forming the patterned sacrificial layer on the side surface of the channel region;

forming the top spacer on the patterned sacrificial layer;

forming the insulating layer on the substrate, wherein the top spacer and the patterned sacrificial layer are enclosed by the insulating layer, and the insulating layer comprises a top source/drain opening above the top spacer; and forming the top source/drain region in the top source/drain opening.

9. The method of claim 8, wherein forming the top source/drain region comprises performing an epitaxial growth process using the channel region as a seed layer.

10. The method of claim 9, wherein the top source/drain region contacts a portion of the insulating layer defining the top source/drain opening.

11. The method of claim 1, further comprising forming an active region and a field isolation layer on the substrate, wherein the active region is on a side surface of the field isolation layer, and the channel region is formed on the active region, and wherein the portion of the patterned sacrificial layer overlaps the field isolation layer.

12. A method of forming a vertical field-effect transistor (VFET) device, the method comprising:

forming a mask layer on a substrate;

forming a channel region by etching the substrate using the mask layer as an etch mask;

forming a bottom source/drain region on the substrate;

forming a first liner extending on a side surface of the channel region and on a side surface and an upper surface of the mask layer;

forming a patterned sacrificial layer on a lower portion of the side surface of the channel region;

forming a top spacer on an upper portion of the side surface of the channel region;

forming an insulating layer on the substrate, wherein the top spacer and the patterned sacrificial layer are enclosed by the insulating layer;

forming a top source/drain opening in the insulating layer by removing the mask layer and a portion of the top spacer;

forming a top source/drain region in the top source/drain opening;

forming a contact opening extending through the insulating layer, wherein the contact opening exposes a portion of the patterned sacrificial layer; and forming a gate electrode on the lower portion of the side surface of the channel region by replacing the patterned sacrificial layer with the gate electrode through the contact opening.

13. The method of claim 12, further comprising:

forming an active region and a field isolation layer on the substrate, wherein the active region is in the field isolation layer, and the channel region is formed on the active region; and forming a gate contact in the contact opening after forming the gate electrode, wherein the gate contact contacts the gate electrode and overlaps the field isolation layer.

14. The method of claim 12, wherein the first liner is between the upper portion of the side surface of the channel region and the top spacer after forming the gate electrode.

15. The method of claim 12, wherein forming the gate electrode comprises:

forming a cavity between the channel region and the insulating layer by removing the patterned sacrificial layer through the contact opening; and sequentially forming a gate dielectric and the gate electrode in the cavity, wherein the gate dielectric encloses the gate electrode in a cross-sectional view.

16. A method of forming a vertical field-effect transistor (VFET) device, the method comprising:

forming a preliminary VFET on a substrate, wherein the preliminary VFET comprises:

a bottom source/drain region on the substrate;

a channel region on the bottom source/drain region;

a top source/drain region on the channel region, wherein the bottom source/drain region, the channel region, and the top source/drain region are sequentially stacked on the substrate;

a patterned sacrificial layer on a side surface of the channel region; and an insulating layer, wherein the top source/drain region and the patterned sacrificial layer are enclosed by the insulating layer;

forming a contact opening extending through the insulating layer, wherein the contact opening exposes a portion of the patterned sacrificial layer;

forming a cavity between the channel region and the insulating layer by removing the patterned sacrificial layer through the contact opening;

forming a gate dielectric in the cavity; and then forming a gate electrode in the cavity, wherein the gate dielectric encloses the gate electrode in a cross-sectional view.

17. The method of claim 16, wherein forming the gate electrode comprises sequentially forming a work function layer and a metallic electrode in the cavity, and wherein the work function layer encloses the metallic electrode in the cross-sectional view.

18. The method of claim 16, further comprising forming a gate contact in the contact opening after forming the gate electrode, wherein the gate contact contacts the gate electrode.

19. The method of claim 16, further comprising forming an active region and a field isolation layer on the substrate, wherein the active region is on a side surface of the field isolation layer, and the channel region is formed on the active region, and wherein the portion of the patterned sacrificial layer overlaps the field isolation layer.

\* \* \* \* \*